United States Patent [19]

Robinton et al.

[11] Patent Number: 4,709,375
[45] Date of Patent: Nov. 24, 1987

[54] DIGITAL PHASE SELECTION SYSTEM FOR SIGNAL MULTIPLIERS

[75] Inventors: Michael A. Robinton, Palo Alto; Alan H. Starkie, San Jose, both of Calif.

[73] Assignee: Robinton Products, Inc., Sunnyvale, Calif.

[21] Appl. No.: 543,095

[22] Filed: Oct. 18, 1983

Related U.S. Application Data

[63] Continuation-in-part of Ser. No. 536,558, Sep. 27, 1983, abandoned.

[51] Int. Cl.$^4$ ............................................. H04B 14/06
[52] U.S. Cl. .................................... 375/27; 332/11 D; 370/108
[58] Field of Search ...................... 375/27, 29, 30, 33, 375/38, 39, 40, 100, 102, 107, 111, 113, 115, 68, 59; 332/11 D; 370/108; 378/81

[56] References Cited

U.S. PATENT DOCUMENTS

| | | | |
|---|---|---|---|
| 2,954,465 | 9/1960 | White | 370/108 |
| 3,281,827 | 10/1966 | Olshausen et al. | 340/347 |
| 3,369,182 | 2/1968 | Reindl | 375/59 |
| 3,414,818 | 12/1968 | Reidel | 375/24 |
| 3,461,406 | 8/1969 | Kroll | 332/1 X |
| 3,488,652 | 1/1970 | Huelsman | 340/347 |
| 3,500,109 | 3/1970 | Sugiyama et al. | 324/99 R |
| 3,591,707 | 7/1971 | Abbott | 358/23 |
| 3,648,177 | 3/1972 | Himmel | 375/68 |
| 3,703,688 | 11/1972 | Flanagan | 332/11 D |
| 3,794,917 | 2/1974 | Martin et al. | 324/142 |
| 3,818,135 | 6/1974 | Tannhauser | 375/67 |
| 3,843,930 | 10/1974 | Burnsweig | 370/108 |
| 3,859,654 | 1/1975 | Harrison et al. | 340/347 AD |
| 3,875,508 | 4/1975 | Milkovic | 324/142 |
| 3,875,509 | 4/1975 | Milkovic | 324/142 |
| 3,913,016 | 10/1975 | Candy | 375/27 |
| 3,934,198 | 1/1976 | Milkovic | 324/142 |
| 3,942,110 | 3/1976 | Milkovic | 324/142 |
| 3,942,172 | 3/1976 | Tucker | 340/347 NT |
| 3,953,795 | 4/1976 | Brunner et al. | 328/160 |
| 3,955,138 | 5/1976 | Milkovic | 324/141 |
| 3,961,257 | 6/1976 | Milkovic | 324/142 |
| 3,975,682 | 8/1976 | Mayfield | 324/142 |
| 4,031,532 | 6/1977 | First | 340/347 NT |
| 4,058,768 | 11/1977 | Milkovic | 324/142 |
| 4,074,194 | 2/1978 | Wilkerson | 324/142 |
| 4,131,847 | 12/1978 | Kohga et al. | 324/141 |
| 4,163,944 | 8/1979 | Chambers et al. | 375/68 |
| 4,182,983 | 1/1980 | Heinrich et al. | 324/142 |
| 4,203,071 | 3/1980 | Bowles et al. | 375/1 |
| 4,215,311 | 7/1980 | Kittel et al. | 375/5 |
| 4,217,546 | 8/1980 | Milkovic | 324/142 |
| 4,228,517 | 10/1980 | Constant | 375/103 |
| 4,275,349 | 6/1981 | Wintermute | 324/141 |
| 4,291,300 | 9/1981 | Bader | 375/28 |
| 4,291,409 | 9/1981 | Weinberg et al. | 375/1 |
| 4,298,984 | 11/1981 | Baker | 375/100 |
| 4,315,212 | 2/1982 | Gamoh | 324/142 |
| 4,320,345 | 3/1982 | Waggener | 375/81 |
| 4,330,753 | 5/1982 | Davy | 329/50 |

FOREIGN PATENT DOCUMENTS

| | | |
|---|---|---|
| 0049520 | 4/1982 | European Pat. Off. |
| WO82/01253 | 4/1982 | PCT Int'l Appl. |
| WO82/04324 | 12/1982 | PCT Int'l Appl. |
| 1373581 | 11/1974 | United Kingdom |
| 2076975 | 12/1981 | United Kingdom |
| 2076976 | 12/1981 | United Kingdom |

OTHER PUBLICATIONS

Inose & Yasuda "A Unity Bit Coding Method by Negative Feedback", Nov. 1963, Proceedings of the IEEE (pp. 1524-1535).

Friedl, Lang & Seyfried "Electronic Three-Phase Four-Wire Power Frequency Converter with High Accuracy over a Wide Range of Use", IEEE on Instrumentation & Measurement, vol. IM-20, Nov. 1971, pp. 308-312.

Primary Examiner—Michael A. Masinick
Assistant Examiner—Stephen Chin
Attorney, Agent, or Firm—Limbach, Limbach & Sutton

[57] ABSTRACT

Phase adjustment techniques are disclosed for use with signal multipliers and the like. A system and method is disclosed for producing selected phase relationship product values in signals which are to be multiplied electronically. In one embodiment, a signal is modulated and then delayed in time by digital shifter prior to multiplication with a second signal. Techniques are disclosed for producing any desired time delay by digital shifter. A system for producing a phase lead in a modulated signal is also disclosed.

45 Claims, 22 Drawing Figures

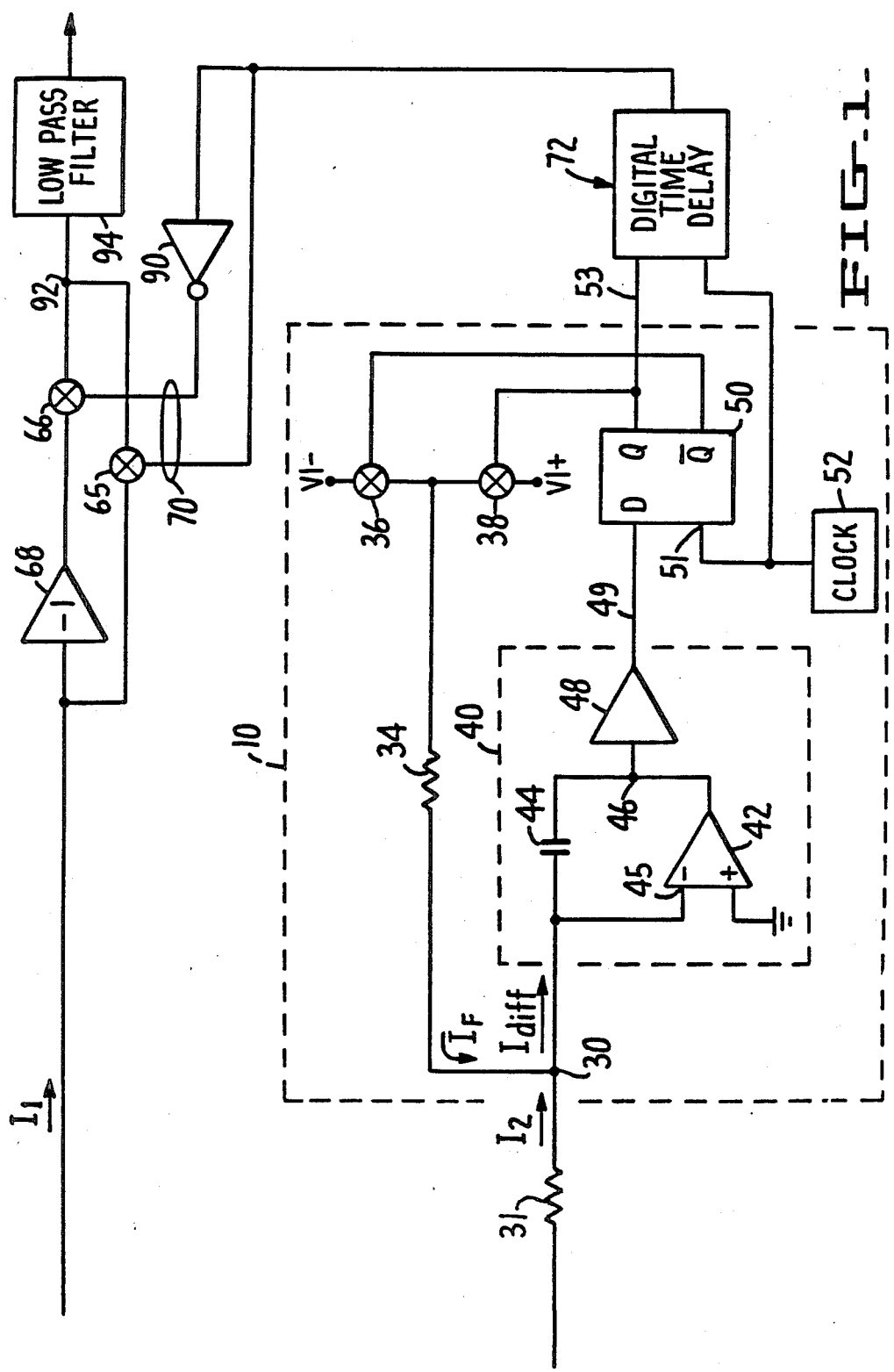

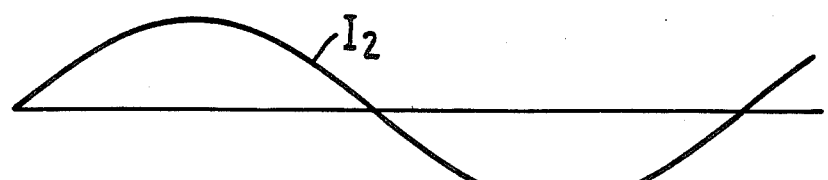
FIG. 2a
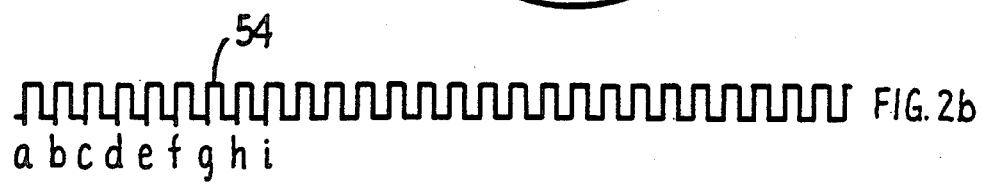
FIG. 2b
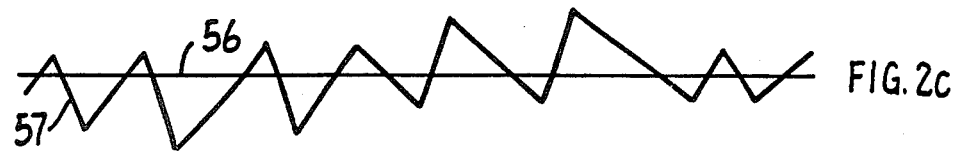
FIG. 2c
FIG. 2d
FIG. 2e
FIG. 2f
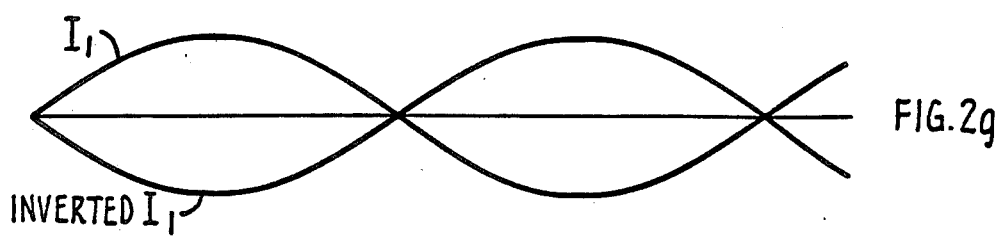
FIG. 2g
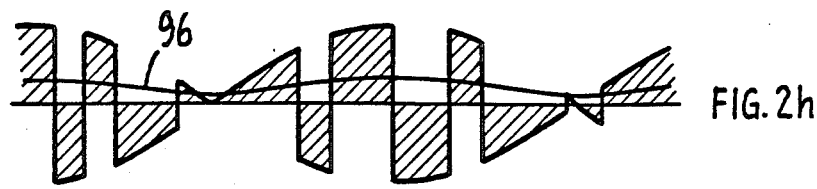
FIG. 2h
FIG. 2.

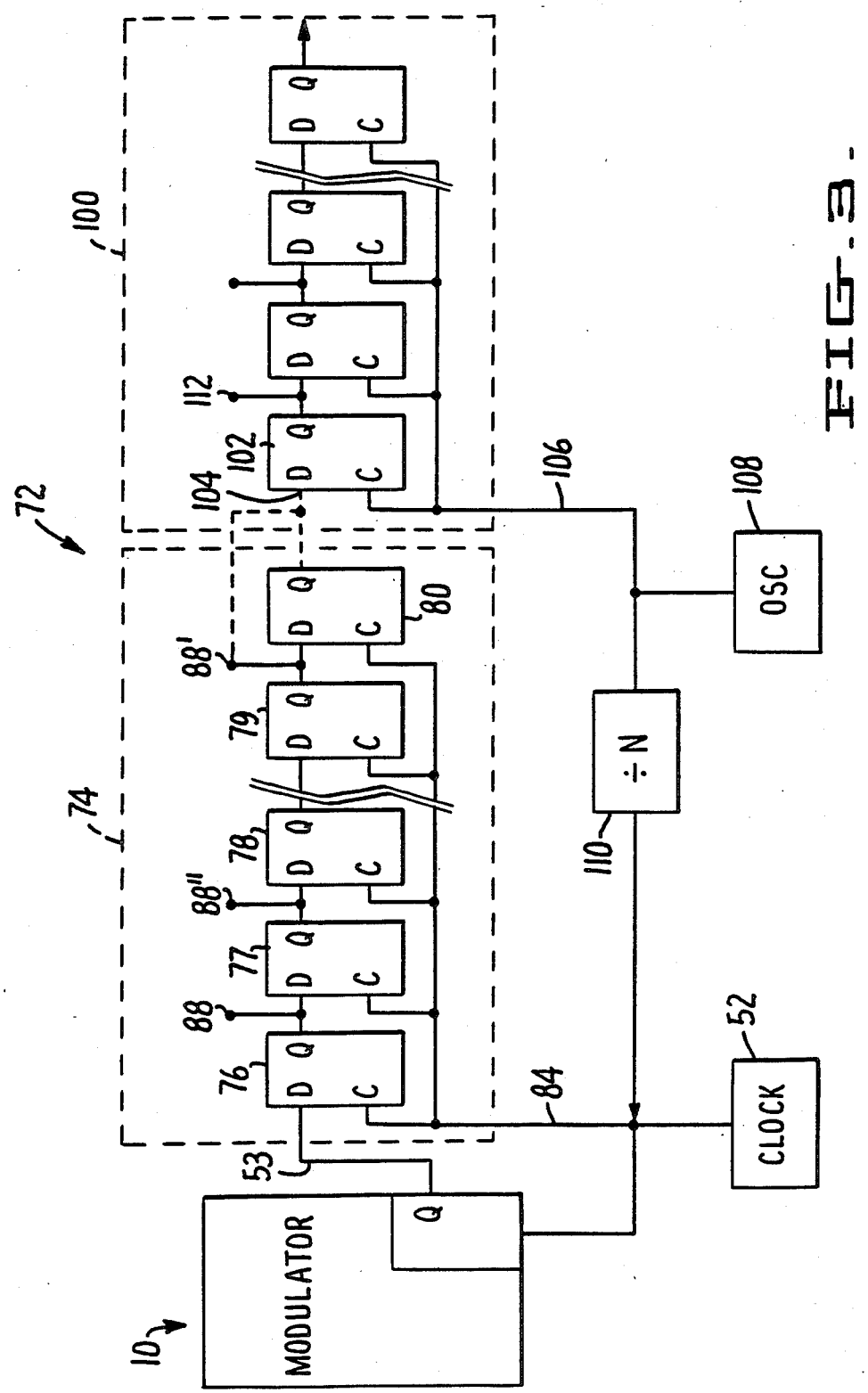

FIG.4a
FIG.4b
FIG.4c
FIG.4d
FIG.4

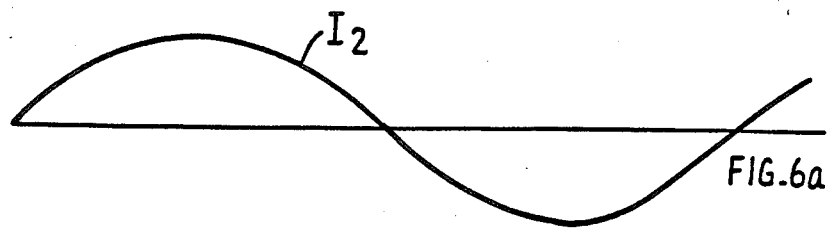
FIG.6a
a b c d e f
FIG.6b
a' b' c' d' e' f'
FIG.6c
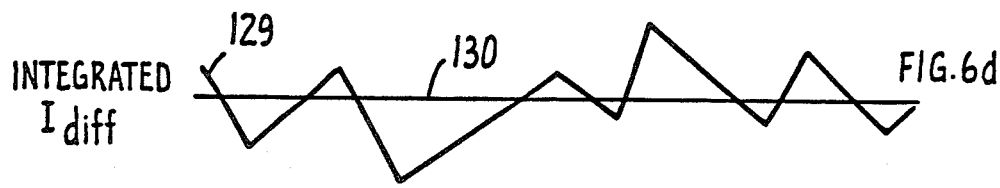
INTEGRATED $I_{diff}$
129
130
FIG.6d
CONTROL SIGNAL
FIG.6e
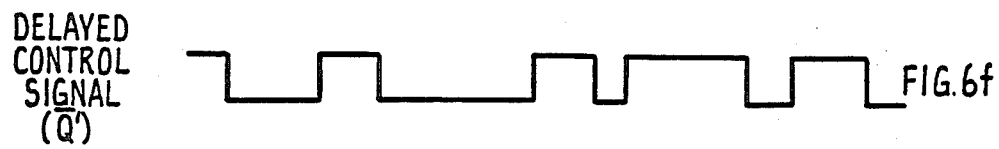
DELAYED CONTROL SIGNAL (Q')
FIG.6f
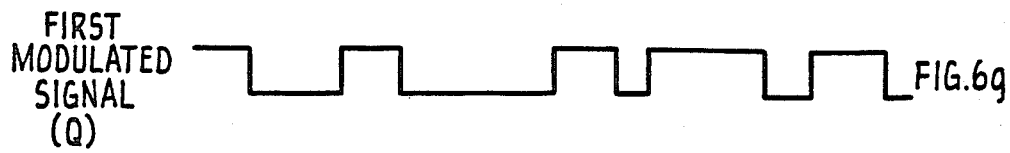
FIRST MODULATED SIGNAL (Q)
FIG.6g
FIG.6.

DIGITAL PHASE SELECTION SYSTEM FOR SIGNAL MULTIPLIERS

BACKGROUND OF THE INVENTION

This application is a continuation-in-part of application Ser. No. 536,558, filed Sept. 27, 1983 now abandoned.

The invention relates generally to phase adjustment techniques suitable for use with signal multipliers and the like and more particularly to electronic signal multipliers which provide for selection of the phase relationship between signals multiplied in order to measure selected phase relationship product values.

The multiplication of two signals A and B of equal frequency, having a phase differential $\theta$, yields a product equal to $A \cdot B \cdot Cos(\theta)$. Various tecniques are available for accmplishing such signal multiplication electronically. One technique is to modulate one of the signals and then gate or switch between opposite polarities of the other signal to produce a composite signal. Generally known as time-division or markspace multiplication, the product signal is usually supplied to a low pass filter which extracts the DC componet. The resultant product signal will be proportional to $A \cdot B \cdot Cos(\theta)$.

It is often desirable to obtain the product of two signals at selected phase differentials by introducing a selected phase adjustment in one or both signals. For example, power utilities introduce a phase differential between the line current and voltage signals when measuring power factor. Two such power factor measurements are termed VARS (for reactive volt-amperes) and Q. In measuring VARS, the current and voltage signals are multiplied together with a 90° phase lag introduced in the voltage signal. Q is measured by multiplying the current and voltage signals with a 60° phase lag introduced in the voltage signal. Together with the measurement of total power consumption, VARS and Q measurements allow a utility to measure power factor.

In prior art systems, phase adjustments are generally introduced by passing one or more of the signals through a tuned RC network. Several disadvantages are inherent in the use of passive component networks such as RC circuits to accomplish signal phase adjustments. Signals passed through lead or lag networks are necessarily perturbed to some degree. Tuned networks are also inherently inflexible, requiring a different network for each desired phase adjustment, in most applications. They are unsuitable for use with digital-type signals because of the distortions they introduce into square wave signals.

It would be desirable to accomplish phase adjustment in signal multiplication without the inherent drift and signal perturbation problems associated with the use of tuned passive element networks, such as RC circuits. Ideally, the means and method of phase adjustment in a signal multiplying circuits should be essentially drift and error free, as well as flexible, permitting adjustment of the amount of phase lead or lag introduced. Furthermore, it would be desirable if phase adjustments could be accomplished in signal multiplying circuits using inexpensive and inherently reliable techniques, so as to provide improved performance at lower cost.

SUMMARY OF THE INVENTION

The present invention provides a means for adjusting the phase relationship between signals in a system for multiplying a first and a second signal together to produce a product signal. The phase adjustment is accomplished with digital components in a manner which reduces undesirable phase perturbations to a minimum. The invention uses digital shifter means for producing a selected time adjustment in at least one of the first and second signals being multiplied, to produce a selected phase relationship between the first and second signals. The digital shifter means includes means for delaying a signal input thereto by a selected number of discrete intervals to produce the selected time adjustment in a manner independent of the signal being adjusted. Means are also provided for multiplying the first and second signals together to produce a product signal which is proportional to the product value of the first and second signals when they have the selected phase relationship.

The invention further encompasses a method fo multiplying a first and second signal together to produce a product signal in which a selected phase adjustment is made in the phase relationship between the first and second signals. The result of such multiplication is a product signal which is proportional to a selected phase relationship power value. The steps in the method include producing a selected time adjustment in at least one of the first and second signals by means of a digital shifter to produce a selected phase relationship between the first and second signals. The time adjustment is accomplished by delaying the signal input into the digital shifter by a selected number of discrete intervals to produce the selected time adjustment in a manner independent of the signal being adjusted. The first and second signals are then multiplied together to produce a product signal which is proportional to the product value of the first and second signals having the selected phase relationship.

BRIEF DESCRIPTION OF THE DRAWINGS

FIG. 1 is a schematic block diagram of a system for multiplying two signals together according to the present invention, including the use of digital means for phase adjustment.

FIG. 2 is a series of graphical illustrations, designated FIGS. 2a through 2h, showing certain selected internal and output signals produced in the signal multiplying system and modulator of FIG. 1.

FIG. 3 is a schematic block diagram illustrating the use of the present invention to provide a selected time delay in a modulated signal.

FIG. 4 is a series of graphical illustrations, designated FIGS. 4a through 4d, showing a selected phase adjustment in a modulated signal using one embodiment of the present invention.

FIG. 6 is a series of graphical illustrations, designated FIGS. 6a through 6g, showing certain selected internal and output signals produced in the modulator of FIG. 5.

DESCRIPTION OF THE PREFERRED EMBODIMENT

Figure 5:
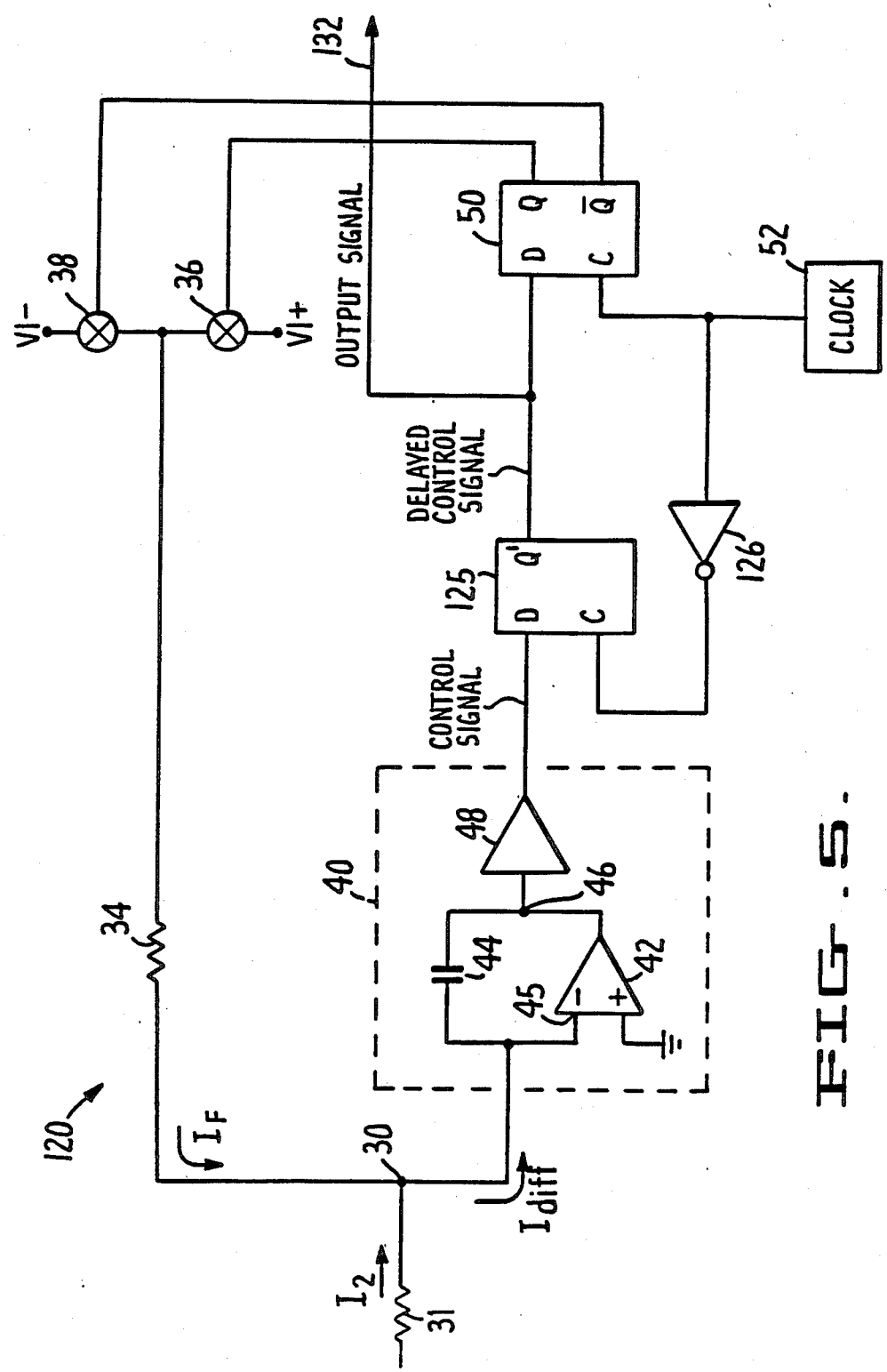
FIG. 5 is a schematic block diagram showing another alternative means for signal phase adjustment in accordance with the present invention, particularly showing the generation of a phase lead in a modulated signal output from a modulator such as that shown in FIG. 1.

Referring to FIG. 1, a system is shown for multiplying together a first signal $I_1$ and a second signal $I_2$. Such signals could, for examaple, be representative of signals proportional to the current and voltage, respectively, of power carried on a power line. Signals $I_1$ and $I_2$ are assumed to be periodic waveforms, not necessarily sinusoidal, having a predetermined phase relationship to one another. In the illustrative embodiment shown in FIG. 1, multiplication is accomplished by the technique known as time-division or markspace multiplication, in which one of the signals $I_2$ is manner described below and the modulated signal is then used to gate or reverse the polarity of the other signal $I_1$ to obtain a product signal.

The modulator for accomplishing modulation of signal $I_2$ is shown in box 10 of FIG. 1. Modulator 10 is a delta-minus-sigma modulator which converts an analog input signal to a modulated output changeable between two levels at predetermined intervals. A similar type of modulator is described in the following copending patent applications, by all the inventors of the present invention, as follows: Ser. No. 518,820, filed Aug. 1, 1983 entitled Pulse Modulator and Method with Wide Dynamic Range, Ser. No. 518,832, filed Aug. 1, 1983, entitled Modulated Signal Output System and Method, and Ser. No. 536,558, filed Sept. 27, 1983, entitled Power Metering System and Method.

Modulator 10 receives an input signal such as signal $I_2$ and supplies it to a summing node 30. The modulator includes a feedback path which supplies a feedback signal $I_F$ to summing node 30 through input resistor 31 from a pair of reference sources $V_{1+}$ and $V_{1-}$. The reference sources are connected to summing node 30 through a feedback impedance 34 and a pair of switches 36 and 38. A characteristic of delta-minus-sigma modulation is that the feedback signal $I_F$ balances the input signal $I_2$ over time. Instantaneous differences between $I_F$ and $I_2$ are represented by a difference signal $I_{diff}$, which is supplied to a measuring circuit enclosed in box 40. Measuring circuit 40 includes an integrator, in the form of operational amplifier 42, and a feedback capacitor 44. The difference signal $I_{diff}$ is supplied to the inverting input 45 of amplifier 42. A positive $I_{diff}$ causes the output of amplifier 42 to ramp downward and an negative $I_{diff}$ causes the output of amplifier 42 to ramp upward. The voltage appearing at point 46 is termed the integrated difference signal and is supplied to a comparator 48 which outputs what is termed herein a control signal. The control signal goes high when the integrated difference signal is above a predetermined threshold level within comparator 48 and goes low when the integrated difference signal is below such threshold level.

The control signal is supplied on line 49 to the D input of a bistable circuit 50. Bistable circuit 50 is a conventional flip-flop having Q and $\overline{Q}$ outputs changeable between two levels at intervals determined by a clock signal supplied to clock input 51. A suitable oscillator will serve as a clock 52 for the bistable circuit, determining the clock intervals at which bistable cirucit 50 is changeable. The Q and $\overline{Q}$ outputs of bistable circuit 50 are the inverse of one another. In other words, when Q is high $\overline{Q}$ is low, and vice versa. The Q and $\overline{Q}$ outputs are used to control the switches 36 and 38 of the feedback circuit supplying feedback signal $I_F$ to summing node 30. Since the Q and $\overline{Q}$ signals control the switches, only one of switches 36 and 38 will be closed at any time. Feedback signal $I_F$ therefore alternates between positive and negative values in response to the signals output from bistable circuit 50. For the purposes of this description, only the Q output of bistable circuit 50 will be referred to as the first modulated signal.

Feedback of the modulated signal is inherent in delta-minus-sigma modulation. In modulator 10 the feedback loop, which consists of feedback reference sources $V_{1+}$ and $V_{1-}$ and their associated switches for producing feedback signal $I_F$, summing node 30, at which the feedback signal and output signal $I_2$ are combined, measuring circuit 40 and bistable circuit 50. The feedback signal $I_F$ is changeable between positive and negative values concurrent with changes in the modulated output of bistable circuit 50. Because $I_F$ balances the input signal $I_2$ over any sufficient interval, it is only the instantaneous differences between $I_F$ and $I_2$, represented by $I_{diff}$, that must be integrated and measured by measuring circuit 40. Modulator 10 produces a modulated signal changeable only at predetermined clock intervals. Such a signal is susceptible of highly efficient digital manipulation in accordance with the present invention.

A more detailed description of the operation of modulator 10 will be described with reference to FIG. 2. FIG. 2a shows an illustrative input signal $I_2$. FIG. 2b shows the output of oscillator 52, clock signal 54. Assuming bistable circuit 50 clocks only on the leading edge of an upwardly moving pulse, the clock intervals will be between points a, b, c, d, e, etc. FIG. 2c illustrates the integrated difference signal output from amplifier 42, at point 46. The threshold level of comparator 48 is illustrated in FIG. 2c by line 56. The sawtooth waveform shown in FIG. 2c varies around comparator threshold 56, and is generated in the following manner: Assuming that at clock pulse a the input signal supplied to summing node 30, which is $I_2$ of FIG. 2a, is positive and the Q output of modulator 50 on line 53, is low, then feedback signal $I_F$ will be negative. $I_F$ is negative because, with Q low, $\overline{Q}$ will be high causing switch 36 to be open and switch 38 to be closed, connecting negative reference source $V_{1-}$ to summing node 30. The values of reference sources $V_{1+}$ and $V_{1-}$ and impedance 34 are chosen so that $I_F$ will overcome the largest anticipated input signal into the modulator, over time. Since, in our example, $I_F$ is positive, charge will flow into summing node 30 and the difference signal $I_{diff}$ will be positive. Since $I_{diff}$ is supplied to the inverting input 45 of amplifier 42, a positive $I_{diff}$ will cause the integrated difference signal at point 46 to ramp down, as illustrated in the first leg 57 of FIG. 2c. When the integrated difference signal crosses comparator threshold 56, the output of comparator 48, called the control signal, will change from high to low. FIG. 2d shows the control signal 59. Since the control signal is supplied to the D input of bistable circuit 50, when the control signal goes low, the Q output will go low at the next clock pulse b. FIG. 2e illustrates the Q output of bistable circuit 50. At clock pulse b, Q goes from high to low, which will cause a reversal of the states of switches 36 and 38, changing $I_F$ from positive to negative. With $I_F$ negative, $I_{diff}$ also becomes negative, causing the output of amplifier 42, at point 46, to ramp upwardly. As soon as comparator theshold 56 is crossed, the control signal goes from low to high, which causes Q to go high at the next clock pulse c. When Q goes high, $I_F$ again becomes positive and the process repeats itself.

The modulated signal output from modulator 10 is proportional to signal $I_2$. If the input signal is zero, the modulated signal will be high exactly the same amount of time it is low, assuming equal values for references sources V1+ and V1−. With a zero input, only the feedback signal $I_F$ will be supplied to summing node 30, and $I_F$ will be switched between positive and negative values equally, over any sufficient interval, in order to balance the charge at summing node 30. If $I_2$ has a positive value, the positive current into summing node 30 must be balanced by a predominately negative $I_F$. Consequently, when $I_2$ is positive, Q will be low a greater portion of the time. If $I_2$ is negative, Q will average high a greater proportion of the time. The modulated signal produced at the Q output can remain at one level through any number of clock intervals, in order for the feedback signal $I_F$ to balance the input signal. Consequently, the modulated signal does not always change at regular intervals, but is changeable only at certain predetermined intervals, which has certain advantages described below.

Returning to FIG. 1, it is assumed that signals $I_1$ and $I_2$ are to be multiplied together by conventional time-division or markspace multiplication. Such multiplication is accomplished by modulating one of the two signals and employing the modulated signal to control a gating means which switches the polarity of the other of the signals in a manner which yields a product signal having a magnitude proportional to the multiplied signal product. In the embodiment of FIG. 1, signal $I_2$ is modulated and signal $I_1$ is supplied to a pair of switches 65 and 66 which together form gating means for accomplishing signal multiplication. Signal $I_1$ is supplied to the gating means in both inverted and non-inverted forms. A conventional inverter 68 in the form of an amplifier configured to have a gain of −1, supplies the signal to switch 66. The non-inverted signal $I_1$ is supplied to switch 65. The modulated signal for controlling switches 65 and 66 is supplied to the gating means via line 70.

In order to achieve a selected phase relationship between signal $I_1$ and $I_2$, the embodiment of FIG. 1 employs a digital shifter 72 which introduces a selected delay in the output of modulator 10. Digital shifter 72 can take numerous forms, a simple version being illustrated in box 74 of FIG. 3. The operation of a shift register can be illustrated conveniently as a series stages made up of bistable circuits 76 through 80 connected so that the Q output of one bistable circuit is supplied to the D input of the adjacent bistable circuit. A clock signal supplied to each of the bistable circuits via line 84 causes each stage to be clocked simultaneously. A digital pulse on line 53 into shift register 74, either going from low to high or from high to low, will be delayed one input clock interval by each bistable circuit it passes through. For example, if the signal on line 53 goes from low to high, the Q output of bistable circuits 76 will go from low to high at the next clock pulse. Because of inherent switching delays, when the Q output of bistable circuit 76 goes from low to high and that signal is supplied to the D input of bistable circuit 77, its Q output must wait for the succeeding clock pulse to go high. In this manner, digital signals can conveniently be delayed by any desired number of discreet intervals simply by providing enough delaying stages in the shift register. Customarily, shift registers are provided with a plurality of output pins 88 at which the signal can be extracted. The location of the pin determines the overall delay introduced, as a function of the clock frequency.

In the example given below, the digital time delay means 72, shown in FIG. 1, is assumed to be a conventional shift register such as shift register 74 of FIG. 3. The present invention calls for the introduction of a selected time adjustment in one of the signals to be multiplied using a digital shifter to introduce a delay which is a selected number of discrete intervals. Shift register 74 is a suitable digital shifter for producing such a delay. Referring again to FIG. 2, it will be assumed that signals $I_1$ and $I_2$ are to be multiplied together and that a 90 degree phase lag will be introduced into signal $I_2$. The output of modulator 10 is shown in FIG. 2e, and is carried on line 53 of FIGS. 1 and 3. The clock signal from modulator clock 52 is supplied to shift register 74 via line 84. In the example given, the clock intervals, shown in FIG. 2b, are twenty-four times the frequency of signal $I_2$. A 90 degree phase lag will therefor require a delay of six clock intervals. Assuming pin 88' of shift register 74 to be the sixth pin, signal $I_2$, modulated and delayed by 90 degrees, will appear at pin 88'. That is because the modulated signal on line 53 will have passed through six stages of shift register 74 to reach pin 88' and will thus have been delayed by a total of six clock intervals output from clock 52. The pin 88' output of shift register 74 is illustrated in FIG. 2f. The delayed modulated signal shown in FIG. 2f is an exact reproduction of 0the modulated Q output of modulator 10, shown in FIG. 2e, moved to the right six clock intervals.

Signal multiplication is accomplished by supplying the delayed modulated signal shown in FIG. 2f to the signal gating means, via line 70. Line 70 includes both inverted and non-inverted versions of the delayed modulated signal by supplying the signal to a conventional digital inverter 90. Signal $I_1$ is that shown in FIG. 2g both in inverted and non-inverted forms. Multiplication is carried out by means of switches 65 and 66, which are opened and closed alternately from one another, switching point 92 of FIG. 1 between the non-inverted and inverted versions of signal $I_1$. The resultant signal is shown in FIG. 2h. The signal in FIG. 2h can then be passed through a suitable low pass filter 94 to produce an averaged or D.C. value, as shown with line 96 of FIG. 2h. Line 96 represents a product signal proportional to the product value of $I_1$ and $I_2$ with a phase lag of 90 degrees introduced in $I_2$. If, for example, signal $I_1$ was proportional to current carried on a power line and signal $I_2$ was proportional to line voltage, the product signal represented by line 96 of FIG. 2h would be proportional to VARS.

A particular advantage of using a delta-minus-sigma modulator such as modulator 10 in conjunction with the present invention is that the modulated signal is changeable only at predetermined clock intervals. Digital time delay techniques necessarily divide an incoming signal into discrete units or intervals. The length or duration of those intervals is a matter of design choice. Digital-type signals carry information at pulse edges, when the signal goes from low to high or high to low. A shift register made up of a series of bistable circuits will "look" for such pulse edges each time it is clocked. The higher the clock frequency, the more frequently is the incoming signal sampled for a pulse edge. Since the delay introduced in a signal at each stage of a shift register depends on the clock frequency, shift registers clocked at a high frequency require more stages to produce a given delay than shift registers clocked at a low frequency. Of course, clocking a shift register at a low frequency means that the incoming signal is sampled less often for pulse edges, and this can be a disadvantage if the location of the pulse edges is not known, as is the case with conventional pulse width modulated signals. Modulator 10 outputs a signal having pulse edges which occur only at predetermined clock intervals. By synchronizing the clock signals supplied to the modulator and to shift register 74, the shift register will "look" for pulse edges only at the times required. This means that fewer shift register stages are needed to introduce a given delay in a modulated signal than would be the case if the location of the pulse edges were not precisely known. In fact, in the example given above, the shift register can be clocked at the same rate as modulator 10, with no loss of information whatsoever. It is therefore possible to use an economical shift register, possessing relatively few stages, to produce a given delay in a delta-minus-sigma modulated signal, which when a far larger shift register would be needed to produce a comparable delay in a signal having pulse edges at random locations. Even if a relatively high frequency shift register was employed to delay a substantially lower frequency randomly modulated signal, some loss of information would occur whenever a pulse edge was not precisely synchronized with the shift register clock. No such loss of information occurs in the embodiment of the present invention described above since the modulator and shift register are synchronized with one another and pulse edges are therefore not "missed".

The clock intervals by which the shift register is clocked need not be exactly the same as the clock intervals of the modulator 10. It is, however, preferable that the shift register clock be synchronized with the modulator clock. To avoid loss of information, the shift register clock should operate at a frequency no lower than that of the modulator, but may operate at higher rates to achieve virtually any desired time delay. A convenient way of increasing the frequency of the shift register clock while maintaining synchronization with the clock intervals of the modulator is to use a frequency divider for the modulator clock. While in the example described above, the desired time delay in the modulated signal corresponded with an integer number of modulator clock intervals, that may not always be the case. In order to achieve additional flexibility in the selection of a time delay it may be desirable to include either an additional shift register or additional stages within a single shift register which are clocked at a higher frequency and which therefore introduce incremental delays in the modulated signal. The shift register stages within box 100 of FIG. 3 illustrate a technique for providing further selectively in the digital time adjustment of the present invention. In this example, the delayed signal output from any selected stage of shift register 74 is supplied to a second group of shift register stages shown in FIG. 3 as a shift register 100. A plurality of bistable circuits 102 make up shift register 100. The delayed signal from shift register 74 is supplied to the input 104 of shift register 100. A clock signal via line 106 preferably having a higher frequency than clock 52, is supplied to the bistable circuits which form shift register 100. The higher clock frequency can conveniently be provided by means of an oscillator 108 operating at a higher frequency than clock 52. Through use of a suitable frequency divider 110, clock signals of different frequencies can be supplied to the various shift register stages, as well as to modulator 10, if desired.

As used herein, the term clock intervals A generally refer to the clock signals output from clock 52 and clock intervals B will be those output from second clock 108. In addition, the shift register stages illustrated in FIG. 3 can be thought of either as a shift register 74 and an additional shift register 100, or a single shift register having a plurality of stages which are clocked at various selected frequencies. Either through use of separate oscillators or a single oscillator with a frequency divider, the provision of different clock signals increases the flexibility of the digital shifting techniques used in the present invention. Delaying a signal with a shift register having a number of stages all clocked at the same rate allows a signal to be delayed by any number of discrete intervals, up to the maximum number of stages in the shift register. By providing additional stages clocked by a different clock signal, additional selected delay intervals can be provided. A signal can be passed through one shift register and delayed a certain number of clock intervals, A and then passed through another set of shift register stages and delayed and additional number of intervals. B Thus, a delay of virtually any desired whole and fractional increments of the intervals A can be provided. Similar flexibility in signal delays by digital means can be achieved by using a clock which operates at the same frequency as the clock, A but is offset in time by a selected amount. For example, if a signal is passed through a shift register clocked at intervals A and then supplied to an additional stage clocked with the inverse of the interval clock A signal, an additional delay of one-half of a clock interval A will be introduced. Depending on the offset between the clock signals supplied to the two groups of shift register stages, almost any amount of delay can be introduced.

An example of the operation of the modulator and digital time delay means of FIGS. 1 and 3 is given in FIG. 4. Assuming a clock signal A supplied by clock 52 to be that shown in FIG. 4b and a clock signal B supplied by second clock 108 to be that shown in Figure 4a, a modulated signal input to the shift register will be delayed in the manner described below. In this example, clock 108 is exactly twice the frequency of clock 52. If, for example, a delay in the modulated signal of two-and-a-half clock intervals A is desired, the shift register will be configured so that output pin 88" is connected to the shift register 100 input 104. In that way, a modulated signal input via line 53 will pass through two shift register stages 76 and 77 and into shift register 100 stage 102, after which the signal is output at pin 112. The signal will be delayed two full clock intervals and an additional clock interval B by such a system. Assuming a modulated signal as appears in FIG. 4c is input to the configuration described above, the output at pin 112 will be the signal shown in FIG. 4d. The delayed modulated signal shown in FIG. 4d is exactly the same as the modulated signal shown in FIG. 4c, delayed by two-and-a-half clock intervals A.

The digital shifting technique of the present invention has the advantage inherent in digital electronics of being relatively drift-free and error-free. Furthermore, the time adjustment is made in a manner independent of the signal being adjusted—in other words, it is not dependent on the frequency of the signal being adjusted in time. The system shown in FIG. 1 allows for phase adjustment in the multiplication of two analog signals without the use of R.C. networks and their associated signal perturbations. If delta-minus-sigma modulation is employed in the multiplication, the size of the shift registers employed need not be prohibitively large, while yielding a high level of accuracy.

Digital means can also be used to produce a phase lead in a signal being modulated in a delta-minus-sigma modulating. Referring to FIG. 5, a modulator 120 is shown which is similar to modulator 10 of FIG. 1. In the description below, the reference numbers appearing in FIG. 1 for modulator 10 will be repeated for like elements in modulator 120. As before, modulator 120 includes a bistable circuit 50 controlling a source of feedback current $I_F$ through switches 36 and 38. A summing node 30 receives the input signal, which can in this example be $I_2$ through input resistor 31. Instantaneous differences between the feedback and input signals are represented by $I_{diff}$ and that difference signal is measured by measuring circuit 40. As before, the control signal output from comparator 48 is high when the integrated difference signal is above the threshold of the comparator and is low when the integrated difference signal is below the threshold.

Modulator 120 differs from modulator 10 in FIG. 1 in that it includes a digital shifter between measuring circuit 40 and bistable circuit 50. The digital shifter introduces a time delay in the control signal output from comparator 48. In FIG. 5 the digital shifter is a bistable circuit 125, which receives the control signal output from the comparator at its D input. For the purposes of the example given below, bistable circuit 125 is clocked at the same rate as bistable circuit 50, but one half clock interval out of phase.

Operation of the modulator shown in FIG. 5 to achieve phase lead in the modulated output signal will be described with reference to FIG. 6. Input signal $I_2$ to modulator 120 is shown in FIG. 6a. The output of clock 52 is shown in FIG. 6b. Clock 52 also supplies the signal to bistable circuit 125 through an inverter 126, and the second clock signal is shown in FIG. 6c. If $I_2$ is positive at clock pulse a and the Q output of bistable circuit 50, shown in FIG. 6g, is initially high, $I_F$ will be positive into summing node 30. That will produce a positive $I_{diff}$ which is supplied to the inverting input 45 of integrating amplifier 42, causing the integrated difference signal at point 46 to initially ramp downward, at 129 of FIG. 6d. Line 130 in FIG. 6d represents the threshold of comparator 48. When the integrated difference signal crosses threshold 130, the control signal shown in FIG. 6e goes from high to low. Assuming bistable circuit 125 clocks on upwardly moving pulses a', b', c', d', e', etc., the output of bistable circuit 125 will go from high to low at clock pulse a'. The output of bistable circuit 125 (Q') is referred to herein as the delayed control signal, which is subsequently supplied to the D input of bistable circuit 50. FIGS. 6f shows the delayed control signal and FIG. 6g shows the Q output of bistable circuit 50. When Q' goes from high to low, the Q output of bistable circuit 50 will go from high to low at its next clock pulse b. The change in Q opens switch 36 and closes switch 38, causing $I_F$ to go negative. The integrated difference signal then ramps upward, crossing comparator threshold 130 and again causing the control signal to go high. At clock pulse d' of FIG. 6c, the Q' output of bistable circuit 125 again goes high. That causes the Q output of bistable circuit 50 to go high at its subsequent clock pulse e.

The process described above will continue, with the Q output of bistable circuit 50 providing the signals for controlling the feedback of the modulator. Assuming the time delay introduced by the digital shifter represented by bistable circuit 125 is not large enough to create instability in the feedback loop, modulator 120 will produce a modulated signal equivalent but not identical to that output from modulator 10. By equivalence, what is meant is that the Q output of bistable circuit 50 will be a modulated signal changeable at predetermined clock intervals in a manner proportional to the signal input to the modulator. The Q' output bistable 125 will lead the Q output of bistable circuit 50 by an amount dependent on the differences in the clock signals supplied to the two bistable circuits. This lead occurs as a natural consequence of the fact that the Q output of bistable circuit 50 will change only at the next clock pulse following a change in the Q' output of bistable 125. The Q' output thus is a true "leading" signal to the Q output.

In the above example, if a line is used to output the delayed control signal from the modulator, the output signal will have a phase lead of one-half of a clock interval, as compared with the Q output of bistable circuit 50. Since the clock intervals supplied to both bistable circuit 125 and bistable circuit 50 are the same, the delayed control signal output on line 132 will be changeable at the same intervals as the Q output of bistable circuit 50 and will otherwise resemble any other delta-minus-sigma modulated signal. The clock signal supplied to bistable circuit 125 in effect becomes the determining clock signal governing changes in the output of the modulator. It would be possible to substitute another type of digital shifter, such as a multi-stage shift register, for bistable circuit 125, if the delay introduced is not so long as to destabilize the feedback loop. The digital shifter used might also be clocked at a different rate than the bistable circuit 50, although that would change the characteristics of the delayed control signal. If, for example, a multi-stage shift register clocked at a high rate were inserted in place of bistable circuit 125, it would delay the control signal by a selected number of short intervals. The output of such a shift register would be a delayed control signal which is changeable at the higher clock rate. A shift register of the type shown in FIG. 3 could also be employed, having different stages clocked at different rates. In such a configuration, the longest clock interval used to clock any of the stages would determine the intervals at which the final delayed control signal would be changeable. Any system for delaying the control signal should include at least one bistable circuit clocked at discrete intervals in order that the modulated output of the modulator (the delayed control signal) will be changeable at those discrete intervals.

The phase lead produced in modulator 120 can be selected. Such selection is accomplished by adjusting the clock signals supplied to the first bistable circuit 50 and bistable circuit 125. Assuming a clock signal producing pulses at clock intervals A is supplied to bistable circuit 50 and another clock signal producing pulses at second clock intervals B is supplied to the digital shifter (bistable circuit 125), and both and clock intervals A and B are equal, the phase offset between the clock signals will determine the amount of lead in the modulator output. In the example discussed with respect to FIG. 6, the clock of FIG. 6c was the inverse of the clock of FIG. 6c and the total offset was one-half a clock interval. If the clock pulses supplied by the clock to bistable 125 were three-quarters of a clock interval ahead of the pulses supplied to bistable circuit 50, a phase lead of three-quarters of a clock interval would be produced. It is the amount of delay between a change in the Q' output of bistable circuit 125 and the Q output of bistable 50 which determines the amount of lead time in the signal output on line 132.

The amount of phase lead that can be achieved by the embodiment of the present invention shown in FIG. 5 is dependent on the degree of delay that can be introduced into the feedback loop of a delta-minus-sigma modulator without causing it to destablize. It is known, however, that a delay of a fraction of a clock pulse in the manner described in the example above with reference to FIG. 6 is functional and produces the phase lead in the modulated signal described.

Figure 7:
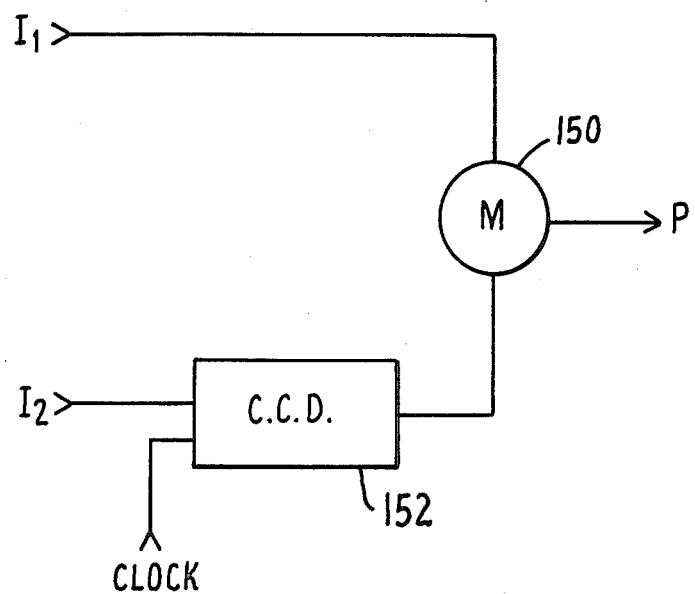
FIG. 7 is a block diagram showing a system in accordance with a further embodiment of the present invention, utilizing a charge coupled device for providing phase adjustment.

Although certain types of digital shifters have been illustrated and described with respect to the present invention, other similar devices can be used to achieve the signal delays which are required. For example, certain types of analog shifters are available which employ digital techniques for introducing delays. Charged coupled devices, referred to as C.C.D.s, could, for example, be employed with the present invention. A simplified block diagram of a system utilizing a C.C.D. is depicted in FIG. 7. Signal $I_1$ is coupled directly to one input of multiplier 150 and signal $I_2$ is coupled to a second input of the multiplier through C.C.D. 152 which provides a predetermined time delay. The output P of multiplier 150 constitutes the product signal. Various configurations of parallel shift registers and analog to digital convertors could also be used. In the embodiments of the invention which includes signal multiplification, it is not required that one or the other of the multiplied signals be modulated. Analog or digital signals can be phase adjusted with respect to one another and multiplied by other techniques within the scope of the present invention. Modulators other than delta-minus-sigma modulators can also be employed to multiply signals. As noted above, delta-minus-sigma modulators do have certain advantages with respect to the use of more economical shift registers in producing signal delays, and for that reason such modulators are well suited for use with the present invention.

The system and method of the present invention for digitally adjusting the phase relationship between signals in a signal multiplier has particular advantages over prior art non-digital phase shifting techniques. The invention uses inherently reliable and drift-free digital techniques for delaying or advancing one or more of the signals supplied to a multiplying circuit. The phase adjustment achieved is actually a time adjustment which is independent of the frequency of the signal being adjusted. In applications such as power metering where only predetermined fixed frequencies are encountered, the use of a digital time delay accomplishes phase adjustment without resort to RC networks and the like. The use of digital shifting techniques for adjusting phase is inherently flexible, allowing a choice in the amount of phase adjustment desired. Using the techniques of the present invention, it is possible to use a single shift register to delay the modulated signal supplied to the multiplier by any selected amount. A single multiplying circuit could be used to produce measurements of VARS or Q at both 50 and 60 Hz, for example.

When used in conjunction with delta-minus-sigma modulation, the shift registers forming the digital shifters need not be overly large, keeping costs to a minimum. The invention thus provides a reliable and economical means for introducing phase adjustments in signal multiplying systems.

What we claim is:

1. Apparatus for producing a product signal from first and second input signals, said apparatus comprising:
   shift means for introducing a selected time shift in said first signal with respect to said second signal so as to produce a time-shifted signal which is changeable in amplitude at first clock times which occur at equal first clock intervals and wherein the duration of said time shift is equal to a plurality and integral number of said first clock intervals, said shift means including modulating means for modulating said first signal so as to produce a modulated signal changeable between two levels at second clock times which occur at second clock intervals, with the average amplitude of said modulated signal over time being indicative of the amplitude of said first signal, and with said modulated signal being utilized by said shift means to produce said time-shifted signal; and
   multiplier means for multiplying said time-shifted signal and said second signal to generate said product signal.

2. The apparatus of claim 1 wherein said shift means further includes delay means for delaying said modulated signal to produce said time-shifted signal.

3. The apparatus of claim 2 wherein said first and second clock times are synchronous.

4. The apparatus of claim 3 wherein said second clock intervals are at least as long as said first clock intervals.

5. The apparatus of claim 3 wherein said first and second clock intervals are equal.

6. The apparatus of claim 4 wherein said first clock intervals are shorter than said second clock intervals.

7. The apparatus of claim 3 wherein said delay means includes a first shift register having a plurality of stages, with said first shift register being clocked at said first clock times and with said time-shifted signal being present at an output of said first shift register.

8. The apparatus of claim 7 wherein said delay means includes a second shift register having a plurality of stages, with said second shift register being clocked at third clock times which occur at third clock intervals.

9. The apparatus of claim 8 wherein said first, second and third clocks are synchronous.

10. The apparatus of claim 9 wherein said first clock intervals are shorter than said third clock intervals.

11. The apparatus of claim 10 wherein an input of said second shift register receives said modulated signal and an output of said second shift register is coupled to an input of said first shift register.

12. The apparatus of claim 11 wherein said second and third clock intervals are the same.

13. The apparatus of claim 1 wherein said modulator means includes:
   a first bistable circuit which outputs said modulated signal;
   feedback means for producing a feedback signal, in response to said modulated signal, which balances over time said first input signal; and
   measuring circuit means for measuring instantaneous differences between said first input signal and said feedback signal and for producing a control signal changeable between two levels, in response to said instantaneous differences, which is coupled to an input of said first bistable circuit.

14. The apparatus of claim 13 wherein said shift means further includes delay means for delaying said modulated signal to produce said time-shifted signal.

15. The apparatus of claim 14 wherein said first and said second clock times are synchronous.

16. The apparatus of claim 15 wherein said delay means includes a first shift register having a plurality of stages, with said first shift register being clocked at said first clock time.

17. The apparatus of claim 16 wherein said delay means further includes a second shift register clocked at third clock times which occur at third clock intervals, with said second shift register having an input which receives said modulated signal and an output which is coupled to an input of said first shift register, with said time-shifted signal being present at an output of said first shift register.

18. The apparatus of claim 17 wherein said first clock intervals are shorter than said third clock intervals.

19. The apparatus of claim 13 wherein said modulated signal is said time-shifted signal, with said first and second clock times being the same and said feedback means includes delay means for delaying said modulated signal a selected number of third clock intervals.

20. The apparatus of claim 19 wherein said delay means includes a second bistable circuit clocked at third clock times which occur at said third clock intervals.

21. The apparatus of claim 20 wherein said first and third clock times are synchronous.

22. The apparatus of claim 21 wherein said first signal and third clock intervals are the same.

23. A method for producing a product signal from first and second input signals, said method comprising the following steps:
producing a time-shifted signal from said first input signal which is changeable in amplitude at first clock times which occur at first equal clock intervals, said time-shifted signal being produced by modulating said input signal so as to produce a modulated signal changeable between two levels at second clock times which occur at second clock intervals, with the average amplitude of said modulated signal over time being indicative of the amplitude of said first signal and introducing a selected time-shift with respect to said second signal by delaying said modulated signal to produce said time-shifted signal, with the duration of said selected time-shift being equal to a plurality and integral number of said first clock intervals; and
multiplying said time-shifted signal and said second input signal to generate said product signal.

24. The method of claim 23 wherein said first and second clock times are synchronous.

25. The method of claim 24 wherein said step of delaying said modulated signal is carried out utilizing a first shift register having a plurality of stages, with said first shift register being clocked at said first clock times and said time-shifted signal being present at an output of said first shift register.

26. The method of claim 23 wherein said step of modulating said input signal includes the following steps:
utilizing a first bistable circuit to output said modulated signal;
producing a feedback signal, in response to said modulated signal, which balances over time said first input signal; and
generating a control signal by measuring instantaneous differences between said first signal and said feedback signal, with said control signal being changeable between two levels and coupled to an input of said first bistable circuit.

27. The method of claim 23 wherein said first and second clocks are synchronous.

28. The method of claim 27 wherein said step of delaying said modulated signal is performed utilizing a shift register having a plurality of stages which is clocked at said first clock times.

29. The method of claim 26 wherein said modulated signal is said time-shifted signal, said first and second clocks are the same and said step of producing a feedback signal includes the step of delaying said modulated signal.

30. The method of claim 29 wherein said modulated signal is delayed by a selected number of third clock intervals.

31. The method of claim 30 wherein said step of delaying said modulated signal utilizes a second bistable circuit clocked by a third clock which occurs at said third clock intervals and said first, second and third clock times are synchronous.

32. Apparatus for producing a product signal from first and second input signals wherein the first input signal has an indeterminate amplitude, said apparatus comprising:
shift means for introducing a selected time shift in said first signal with respect to said second signal, which is independent of the amplitude of the first input signal, so as to produce a time-shifted signal which is changeable in amplitude at first clock times which occur at first clock intervals, with said shift means including modulating means for modulating said first signal so as to produce a modulated signal changeable between two levels at second clock times which occur at second clock intervals, with the average amplitude over time of said modulated signal being indicative of the amplitude of said first signal, and with said modulated signal being utilized by said shift means to produce said time-shifted signal; and
multiplier means for multiplying said time-shifted signal and said second signal to generate said product signal.

33. The apparatus of claim 32 wherein said shift means further includes delay means for delaying said modulated signal to produce said time-shifted signal.

34. The apparatus of claim 33 wherein said first and second clock times are synchronous.

35. The apparatus of claim 34 wherein said second clock intervals are at least as long as said first clock intervals.

36. The apparatus of claim 34 wherein said first and second clock intervals are equal.

37. The apparatus of claim 36 wherein said first clock intervals are shorter than said second clock intervals.

38. The apparatus of claim 34 wherein said delay means includes a shift register having plurality of stages, with said shift register being clocked at said first clock times and with said time-shifted signal being present at an output of said shift register.

39. Apparatus for producing a product signal from first and second input signals, said apparatus comprising:

shift means for introducing a selected time shift in said first signal with respect to said second signal independent of the frequency of the first signal so as to produce a time-shifted signal which is changeable in amplitude at first clock times which occur at first clock intervals, with said shift means including modulating means for modulating said first signal so as to produce a modulating signal changeable between two levels at second clock times which occur at second clock intervals, with the average amplitude over time of said modulated signal being indicative of the amplitude of said first signal, and with said modulated signal being utilized by said shift means to produce said time-shifted signal; and multiplier means for multiplying said time-shifted signal and said second signal to generate said product signal.

40. The apparatus of claim 39 wherein said shift means further includes delay means for delaying said modulated signal to produce said time-shifted signal.

41. The apparatus of claim 40 wherein said first and second clock times are synchoronous.

42. The apparatus of claim 41 wherein said second clock intervals are at least as long as said first clock intervals.

43. The apparatus of claim 41 wherein said first and second clock intervals are equal.

44. The apparatus of claim 42 wherein said first clock intervals are shorter than said second clock intervals.

45. The apparatus of claim 41 wherein said delay means includes a first shift register having a plurality of stages, with said first shift register being clocked at said first clock times and with said time-shifted signal being present at an output of said first shift register.

* * * * *